US012152185B2

(12) United States Patent
Seibald et al.

(10) Patent No.: US 12,152,185 B2
(45) Date of Patent: Nov. 26, 2024

(54) MANGANESE-DOPED RED LUMINESCENT MATERIAL AND CONVERSION LED

(71) Applicant: OSRAM Opto Semiconductors GmbH, Regensburg (DE)

(72) Inventors: Markus Seibald, Kaufering (DE); Dominik Baumann, Munich (DE); Christiane Stoll, Schwabmuenchen (DE); Ion Stoll, Tegernheim (DE); Hubert Huppertz, Tegernheim (DE); Gunter Heymann, Hall in Tirol (AT); Klaus Wurst, Zirl (AT)

(73) Assignee: OSRAM Opto Semiconductors GmbH, Regensburg (DE)

( * ) Notice: Subject to any disclaimer, the term of this patent is extended or adjusted under 35 U.S.C. 154(b) by 615 days.

(21) Appl. No.: 17/610,736

(22) PCT Filed: May 11, 2020

(86) PCT No.: PCT/EP2020/062960
§ 371 (c)(1),
(2) Date: Nov. 12, 2021

(87) PCT Pub. No.: WO2020/229374
PCT Pub. Date: Nov. 19, 2020

(65) Prior Publication Data
US 2022/0220375 A1 Jul. 14, 2022

(30) Foreign Application Priority Data
May 15, 2019 (DE) ...................... 10 2019 207 046.9

(51) Int. Cl.
*C09K 11/68* (2006.01)
*C01B 11/24* (2006.01)
*C09K 11/67* (2006.01)
*H01L 33/50* (2010.01)

(52) U.S. Cl.
CPC ............ *C09K 11/681* (2013.01); *C01B 11/24* (2013.01); *C09K 11/671* (2013.01); *H01L 33/502* (2013.01); *C01P 2002/54* (2013.01); *C01P 2002/72* (2013.01); *C01P 2002/77* (2013.01)

(58) Field of Classification Search
CPC ....... C09K 11/671; C09K 11/67; C09K 11/61; C09K 11/611; C09K 11/613; C09K 11/615; C09K 11/616; C09K 11/57; C09K 11/0805; C09K 11/0827; H01L 33/502
See application file for complete search history.

(56) References Cited

U.S. PATENT DOCUMENTS

| 7,077,980 B2* | 7/2006 | Ramachandran ....... H01J 61/44 313/503 |
| 2021/0024824 A1* | 1/2021 | Jansen ................... H05B 33/14 |
| 2021/0246369 A1 | 8/2021 | Seibald et al. |
| 2023/0159822 A1* | 5/2023 | Seibald ................ C09K 11/617 252/301.4 H |

FOREIGN PATENT DOCUMENTS

| CN | 106800930 A * | 6/2017 | ............. C09K 11/68 |
| CN | 107043624 A | 8/2017 | |
| CN | 107779191 A | 3/2018 | |
| CN | 106753359 B | 5/2019 | |
| WO | 2013175336 A1 | 11/2013 | |

OTHER PUBLICATIONS

Ming et al. "A novel Cs2NbOF5:Mn4+ oxyfluoride red phosphor for light-emitting diode devices" Dalton Transactions, 2018, 47, 16048-16056. Published online Aug. 29, 2018 (Year: 2018).*
Stoll et al. "HF-free solid-state synthesis of the oxyfluoride phosphor K3MnOF7:Mn4+", European Journal of Inorganic Chemistry, 2019, 3383-3388. Published online Jul. 12, 2019 (Year: 2019).*
Stoll et al. "K3WOF7:Mn4+-A red oxyfluoride phosphor", Journal of Fluorine Chemistry, 226 (2019) 109356. Published online Aug. 7, 2019 (Year: 2019).*
Cai; Peiquing, et al., "Luminescence, energy transfer and optical thermometry of a novel narrow red emitting phosphor: Cs2WO2F4:Mn4+", Dalton Transactions, 2017, pp. 14331-14340.
Hu; Tao, et al., "A highly-distorted octahedron with a C2v group symmetry introducing an ultra-intense zero phonon line in Mn4+-activated oxyfluoride Na2WO2F4", Materials Chemestry C, 2017, pp. 10524-10532.
Wang; Qin, et al., "Novel Mn4+-activated oxyfluorid Cs2NbOF5:Mn4+ red phosphor for warm white light-emitting diodes", Optical Materials, 2018, pp. 96-99.
Wang; Zhengliang, et al., "Red phosphor Rb2NbOF5:Mn4+ for Warm White Light-Emitting Diodes with a High Color-Rendering Index", Inorganic Chemistry, 2019, pp. 456-461.
Yang; Zhiyu, et al., "Luminescence of red-emitting phosphor Rb5Nb3OF18:Mn4+ for warm white light-emitting diodes", Journal of Luminescence, 2019, pp. 408-412.
German Search Report for corresponding German application No. 10 2019 207 046.9, dated Mach 5, 2020, 7 pages (for informational purposes only).
International Search Report for corresponding PCT application No. PCT/EP2020/062960, dated Aug. 11, 2020, 3 pages (for informational purposes only).
Paulusz, A.G., "Efficient Mn (IV) Emission in Fluorine Coordination", Journal of the Electrochemical Society: Solid-State Science and Technology, 1973, vol. 120 No. 7, pp. 942-947.

(Continued)

Primary Examiner — Jane L Stanley
(74) Attorney, Agent, or Firm — Viering, Jentschura & Partner mbB; Robert M Bilotta, Jr.

(57) ABSTRACT

A luminophore having the empirical formula $A_3M*O_xF_{9-2x}$:$Mn^{4+}$ where A may be or include Li, Na, Rb, K, Cs, or combinations thereof. M* may be or include Cr, Mo, W, or combinations thereof. x may be or include 0<x<4.5.

12 Claims, 9 Drawing Sheets

(56) References Cited

OTHER PUBLICATIONS

Schmiechen, Sebastian et al., "Toward New Phosphors for Application in Illumination-Grade White pc-LEDs: The Nitridomagnesosilicates Ca[Mg3SiN4]:Ce3+, Sr[Mg3SiN4]:Eu2+, and Eu[Mg3SiN4]", Chemistry of Materials, dated 2014, retrieved from https://pubs.acs.org/doi/abs/10.1021cm500610vjournalCode=cmatex&quickLinkVolume=26&quickLinkPage=2712&selectedTab=citation&volume=26 on Jan. 23, 2023, pp. 2712-2719.

Chen, Daqin et al. "A review on Mn4+ activators in solids for warm white light-emitting diodes," Royal Society of Chemistry, Sep. 5, 2016, pp. 86285-86296.

Zhou, Zhi et al., "Research progress and application prospects of transition metal Mn4+-activated luminescent materials", Royal Society of Chemistry, Sep. 5, 2016, pp. 9143-9161.

Shao, Qiyue et al., "Temperature dependence of photoluminescence spectra and dynamics of the red-emitting K2SiF6:Mn4+ phosphor", Journal of Alloys and Compounds, Oct. 22, 2016, vol. 695, pp. 221-226.

Kim, Minseuk et al., "A novel Mn4+-activated red phosphor for use in light emitting diodes, K3SiF7:Mn4+", Journal of the American Ceramic Society, 2016, pp. 1044-1050, vol. 100.

Pust, Philipp et al., "Narrow-band red-emitting $Sr[LiAl_3Na_4]$:$Eu^2$ as a next-generation LED-phosphor material", Nature Materials, Jun. 2014, pp. 891-896, vol. 13, 2014 Macmillan Publishers Limited.

\* cited by examiner

MANGANESE-DOPED RED LUMINESCENT MATERIAL AND CONVERSION LED

CROSS-REFERENCE TO RELATED APPLICATIONS

The present application is a national stage entry according to 35 U.S.C. § 371 of PCT application No.: PCT/EP2020/062960 filed on May 11, 2020; which claims priority to German Patent Application Serial No.: 10 2019 207 046.9 filed on May 15, 2019; all of which are incorporated herein by reference in their entirety and for all purposes.

TECHNICAL FIELD

The disclosure relates to a luminophore and to a conversion LED comprising the luminophore in particular.

BACKGROUND

In white light-emitting conversion LEDs as used in general lighting, the red component of the white overall radiation is produced by the conversion of blue primary light from a semiconductor layer sequence to longer-wave red radiation by means of an inorganic luminophore. A crucial role is played here by the shape and position of the emission band in the red spectral region. The human eye is fundamentally less sensitive to red radiation than to green radiation, for example. The lower the energy or the greater the wavelength in the wavelength range above 555 nm, the worse/more inefficient the perception of red radiation in particular can be. In a white light-emitting conversion LED, however, the red spectral regions, especially the deep red spectral regions with high wavelengths, are particularly important when the conversion LED is to have a high color rendering index (CRI) in combination with high luminous efficacy of radiation (LER) and low correlated color temperature (CCT). Typical red luminophores for these applications are based on $Eu^{2+}$ or $Ce^{3+}$ emission, these elements being introduced into inorganic host structures in which they then absorb blue light and produce longer-wave emissions. These luminophores generally have broad emission bands. Accordingly, in the case of red-emitting luminophores, many photons are inevitably also converted to those spectral regions (large wavelengths; e.g. >650 nm) that can be perceived only very inefficiently by the human eye. This leads to a severe reduction in efficiency of the conversion LED in relation to eye sensitivity. In order to solve this problem, attempts may be made to shift the emission spectrum to shorter wavelength by variations in the chemical composition of the host structure, i.e. to increase the integral overlap with the eye sensitivity curve. However, the Gaussian distribution of the photons emitted means that this also leads to a reduction in the photon count in the desired red spectral region, and so the abovementioned criteria can no longer be fulfilled.

Luminophores such as the nitridolithoaluminate "$SrLiAl_3N_4:Eu^{2+}$" (WO 2013/175336 A1; Narrow-band red-emitting $Sr[LiAl_3N_4]:Eu^{2+}$ as a next-generation LED-phosphor material, Nature Materials 2014; P. Pust et al.) already have extremely narrow emission bands with FWHM<55 nm, which leads to a reduction in those converted photons which, in the long-wave region of the visible spectrum (long-wave flank of the emission band), are perceived very inefficiently by the human eye. At the same time, however, the emission maximum of $SrLiAl_3N_4:Eu^{2+}$ at about 650 nm is already so far into the deep red region that conversion LEDs with this luminophore as the sole red component have barely any efficiency advantage, if any, over solutions with broader-band luminophores. Efficiency losses here are dominant over the CRI gain (R9). Another luminophore, $SrMg_3SiN_4:Eu^{2+}$ (Toward New Phosphors for Application in Illumination-Grade White pc-LEDs: The Nitridomagnesosilicates $Ca[Mg_3SiN_4]:Ce^{3+}$, $Sr[Mg_3SiN_4]:Eu^{2+}$ and $Eu[Mg_3SiN_4]$, Chemistry of Materials 2014, S. Schmiechen et al.), shows a blue-shifted, likewise extremely narrow emission band (FWHM<45 nm) that has its emission maximum at about 615 nm and hence within an ideal range for red luminophores. Disadvantageously, this compound shows strong thermal quenching, and so almost no emission can be observed even at room temperature. Use in conversion LEDs is therefore impossible.

The shape and position of the emission spectrum depends not only on the chemical composition of the host structure and further factors but also on the nature of the activator ions. The electronic transitions that proceed in the activator ions on absorption and emission then lead to the respective typical emission spectra. For $Eu^{2+}$ these are, as described, bands of greater or lesser width. In order to minimize the loss of efficiency resulting from long-wave photons outside the desired range in the case of red luminophores, it is possible to use, for example, $Mn^{4+}$-doped compounds. Since different electronic transitions take place here compared to $Eu^{2+}$, the emission spectrum here features a line character, with the FWHM values of these lines being much smaller (<10 nm) than the corresponding emission bands, for example for $Eu^{2+}$-based luminophores. A material class that has drawn great attention is that of the $Mn^{4+}$-doped hexafluorosilicates. Particular emphasis is given here to the compound $K_2SiF_6:Mn^{4+}$.

There is thus a great need for red-emitting luminophores having minimum spectral width of emission ("full width at half maximum", FWHM), in order to keep the number of photons in spectral regions of low eye sensitivity small and at the same time to emit many photons in the desired red spectral region.

SUMMARY

It is desirable to specify a luminophore that emits radiation in the red spectral region and has a small spectral width of emission. It is desirable to specify a conversion LED comprising the luminophore described here.

This object/these objects are achieved by a luminophore and a conversion LED according to the independent claims. Advantageous embodiments and developments are the subject of the respective dependent claims.

A luminophore is specified, especially a red-emitting luminophore.

In at least one embodiment, the luminophore has the empirical formula $A_3M^*_cO_xF_y:Mn^{4+}$ where
A=Li, Na, Rb, K and/or Cs,
M*=Cr, Mo and/or W,
$3+6c=2x+y$
$0<x$, $0<y$ and
$0<c$.

In at least one embodiment, the luminophore has the empirical formula $A_3M_bO_xF_y:Mn^{4+}$ where
A=Li, Na, Rb, K and/or Cs,
M=V and/or Nb,
$3+5b=2x+y$
$1<x$, $0<y$ and
$0<b$.

Here and hereinafter, luminophores are described in terms of empirical formulae. In the empirical formulae specified, it is possible that the luminophore includes further elements, for instance in the form of impurities, in which case these impurities taken together should have a maximum proportion by weight in the luminophore of not more than 1 permille or 100 ppm (parts per million) or 10 ppm.

A known Mn-doped luminophore is $K_2SiF_6:Mn^{4+}$. The emission spectrum of this luminophore features narrow emission bands, with the half-height widths of these emission bands being below 10 nm and hence much smaller than the corresponding emission bands, for example for $Eu^{2+}$-doped luminophores. $K_2SiF_6:Mn^{4+}$ has a peak wavelength of 631 nm and is prepared by a precipitation reaction in aqueous hydrofluoric acid (HF) (Efficient Mn (IV) Emission in Fluorine Coordination, A. G. Paulusz, J. Electrochem. Soc.: Solid-State Science and Technology 1973, 942). Reactants used are, for example, $K_2CO_3$ or KF (also formed by dissolution of $K_2CO_3$ in HF), and also $SiO_2$ and a manganese source.

The inventors of the present application have surprisingly succeeded in preparing $Mn^{4+}$-doped oxo fluorides which, when excited with a primary radiation, show emission or secondary radiation with a peak wavelength in the red spectral region between about 625 nm to 635 nm. It is known from the literature that $Mn^{4+}$-doped oxidic compounds fundamentally emit at greater wavelengths than the corresponding fluoridic compounds [A review on $Mn^{4+}$ activators in solids for warm white light-emitting diodes, RSC Advances 2016, Chen et al.; Research progress and application prospects of transition metal $Mn^{4+}$-activated luminescent materials, Journal of Materials Chemistry C 2016, Zhou et al.] With the peak wavelength of the Mn-doped oxo fluorides which is thus at surprisingly short wavelength, the emission is advantageously within a range for red luminophores. By virtue of the position of the peak wavelength and the simultaneously small half-height width of the emission bands, many photons are advantageously emitted in the desired visible red spectral region, and the converted photons in the long-wave red region of the visible spectrum that are perceived very inefficiently by the human eye are kept to a low level. This means that the luminophores are of excellent suitability for a conversion LED that emits white overall radiation since it is possible to achieve a high color rendering index (R9) and a high luminous efficacy of radiation (LER) of the overall radiation. In addition, the luminophores may be used in background lighting devices suitable for representation of large color spaces, for example displays.

Peak wavelength or emission maximum refers in the present context to the wavelength in the emission spectrum of a luminophore at which the intensity is at its maximum within the emission spectrum.

In at least one embodiment, the luminophore has the empirical formula $A_3M^*O_xF_{9-2x}:Mn^{4+}$ where
A=Li, Na, Rb, K and/or Cs,
M*=Cr, Mo and/or W,
and
0<x<4.5.

In at least one embodiment, the luminophore has the empirical formula $A_3M^*O_xF_{9-2x}:Mn^{4+}$ where
A=Li, Na, Rb, K and/or Cs,
M*=Cr, Mo and/or W,
and
x=1, x=2, x=3 or x=4, such as x=1. The luminophore having a proportion of oxygen x=1 has been found to be particularly efficient and stable.

In at least one embodiment, the luminophore has the empirical formula $(K_{1-z}A^*_z)_3M^*O_xF_{9-2x}:Mn^{4+}$ where
A*=Li, Na, Rb, K and/or Cs,
M*=Cr, Mo and/or W,
0≤z≤1, such as 0≤z≤1 and
x=1, x=2, x=3 or x=4.

In at least one embodiment, the luminophore has the empirical formula $K_3M^*O_xF_{9-2x}:Mn^{4+}$ where
M*=Cr, Mo and/or W and
x=1, x=2, x=3 or x=4, such as x=1.

In at least one embodiment, the luminophore has the empirical formula $K_3M^*OF_7:Mn^{4+}$ where
M*=Cr, Mo and/or W, such as M*=Mo or W.

In at least one embodiment, the luminophore has the empirical formula $A_3M_bO_xF_{8-2x}:Mn^{4+}$ where
A=Li, Na, Rb, K and/or Cs,
M=V and/or Nb,
and
1<x<4.

In at least one embodiment, the luminophore has the empirical formula $A_3M_xO_xF_{8-2x}:Mn^{4+}$ where
A=Li, Na, Rb, K and/or Cs,
M=V and/or Nb,
and
x=2 or x=3, such as x=2. The luminophore having a proportion of oxygen x=2 has been found to be particularly efficient and stable.

In at least one embodiment, the luminophore has the empirical formula $(K_{1-z}A^*_z)_3MO_xF_{8-2x}:Mn^{4+}$ where
A*=Li, Na, Rb and/or Cs,
M=V and/or Nb,
0 z 1 and
x=2 or x=3, such as x=2.

In at least one embodiment, the luminophore has the empirical formula $(K_{1-z}A^*_z)_3MO_xF_{8-2x}:Mn^{4+}$ where
M=V and/or Nb,
0<z≤⅔ and
x=2 or x=3, such as x=2. Particularly luminophores including K and Na have been found to be particularly stable and efficient.

In at least one embodiment, the luminophore has the empirical formula $(K_{1-z}Na_z)_3MO_2F_4:Mn^{4+}$ where
M=V and/or Nb, such as M=Nb and
0<z≤⅔, such as z=⅓.

$Mn^{4+}$, in a further embodiment, may be present in molar percentages between 0.1 mol % and 10 mol %, 0.5 mol % to 8 mol % or 1 mol % to 6 mol %.

In at least one embodiment, the luminophore is capable of absorbing primary radiation from the UV to blue spectral region and converting it to secondary radiation within the red spectral region.

Moreover, the luminophore in at least one embodiment has a half-height width of the emission bands below 15 nm. More particularly, the half-height width of the emission band with the maximum intensity (emission maximum, peak wavelength) is below 15 nm.

The half-height width (FWHM, full width at half maximum) is understood here and hereinafter to mean the spectral width at half the height of the maximum emission peak or an emission band or emission line.

The luminophores $K_3MoOF_7:Mn^{4+}$, $K_3WOF_7:Mn^{4+}$ and $K_2NaNbO_2F_4:Mn^{4+}$, for example on excitation with primary radiation from the UV to blue spectral region, emit secondary radiation having a peak wavelength in the red spectral region at about 630 nm. The emission bands of the luminophores have a small half-height width and hence a high light yield on account of a large overlap with the human eye sensitivity curve having a maximum at 555 nm. It is thus possible to use these luminophores to provide particularly efficient conversion LEDs.

A luminophore composition comprising a luminophore described here and an inorganic compound. All details and definitions of the luminophore are also applicable to the luminophore composition, and vice versa.

In at least one embodiment, the luminophore in the luminophore composition has the empirical formula $K_3M^*O_xF_{9-2x}:Mn^{4+}$ where
M*=Cr, Mo and/or W and
x=1, x=2, x=3 or x=4, such as x=1. More particularly, the inorganic compound is $KHF_2$.

In at least one embodiment, the luminophore in the luminophore composition has the empirical formula $K_3MoOF_7:Mn^{4+}$ and the inorganic compound is $KHF_2$.

A conversion LED may include the luminophore or luminophore composition. All details and definitions of the luminophore and of the luminophore composition are also applicable to the conversion LED, and vice versa.

In at least one embodiment, the conversion LED has a semiconductor layer sequence. The semiconductor layer sequence is set up for emission of electromagnetic primary radiation.

In at least one embodiment, the semiconductor layer sequence includes at least one III-V compound semiconductor material.

The semiconductor material is, for example, a nitride compound semiconductor material, such as $Al_nIn_{1-n-m}Ga_mN$ where, in each case, $0 \leq n \leq 1$, $0 \leq m \leq 1$ and $n+m \leq 1$. The semiconductor layer sequence may include dopants and additional constituents. For the sake of simplicity, however, only the essential constituents of the semiconductor layer sequence, i.e. Al, Ga, In and N, are specified, even though they may be partially replaced and/or supplemented by small amounts of further substances. More particularly, the semiconductor layer sequence is formed from InGaN.

The semiconductor layer sequence includes an active layer having at least one pn junction and/or having one or more quantum well structures. In the operation of the conversion LED, electromagnetic radiation is generated in the active layer. A wavelength or the emission maximum of the radiation is within the ultraviolet and/or visible region, especially at wavelengths between 300 nm and 470 nm inclusive.

The conversion LED is set up to emit white or colored light.

In combination with the luminophore present in the conversion LED, the conversion LED is set up to emit red light in full conversion or white light in partial or full conversion. Such conversion LEDs are especially suitable for applications where a high color rendering index (e.g. R9) is required, such as in general lighting or background lighting, for example of displays suitable for representation of large color spaces.

The conversion LED has a conversion element. More particularly, the conversion element comprises or consists of the luminophore. The luminophore at least partly or fully converts electromagnetic primary radiation to electromagnetic secondary radiation in the red spectral region.

In at least one embodiment, the conversion element or conversion LED does not include any further luminophore aside from the luminophore. The conversion element may also consist of the luminophore. The luminophore may be set up to fully convert the primary radiation. In this embodiment, the overall radiation from the conversion LED is in the red region of the electromagnetic spectrum.

In at least one embodiment, the conversion element or conversion LED includes a further red-emitting luminophore as well as the luminophore. The conversion element may also consist of the luminophore and the further red-emitting luminophore. The luminophores may be set up to fully convert the primary radiation. In this embodiment, the overall radiation from the conversion LED is in the red region of the electromagnetic spectrum. For example, the further red-emitting luminophore may have the formula $Sr[Al_2Li_2O_2N_2]:Eu$. $Sr[Al_2Li_2O_2N_2]:Eu$ can crystallize in the tetragonal space group $P4_2/m$. The further luminophore advantageously allows the color locus of the overall radiation to be adjusted as required. In addition, this can achieve particularly high color saturation and efficiency that typically cannot be achieved through the use of just one luminophore.

In at least one embodiment, the conversion element includes a second and/or third luminophore as well as the luminophore. The conversion element may comprise further luminophores as well as the luminophore and the second and third luminophores. For example, the luminophores are embedded in a matrix material. Alternatively, the luminophores may also be present in a converter ceramic.

The conversion LED may include a second luminophore for emission of radiation from the green spectral region.

Additionally or alternatively, the conversion LED may include a third luminophore. The third luminophore may be set up for emission of radiation from the yellow spectral region. In other words, the conversion LED may then include at least three luminophores: a yellow-emitting luminophore, a green-emitting luminophore and the red-emitting luminophore. The conversion LED is set up for full conversion or partial conversion, with the primary radiation in the case of full conversion being selected from the UV to blue spectral region, and in the case of partial conversion from the blue region. The resulting overall radiation from the conversion LED in that case is especially white mixed radiation.

Additionally or alternatively, the conversion LED may include a fourth luminophore. The fourth luminophore may be set up to emit radiation from the blue spectral region. In that case, the conversion LED may comprise at least three luminophores: a blue-emitting luminophore, a green-emitting luminophore and the red-emitting luminophore. The conversion LED is set up for full conversion, with the primary radiation in the case of full conversion being selected from the UV spectral region. The resulting overall radiation from the conversion LED in that case is especially white mixed radiation.

Yellow, blue and green luminophores are known to the person skilled in the art and are not listed here separately.

Luminophores present in addition to the luminophore may especially increase the color rendering index. Further luminophores in addition to the second, third and/or fourth luminophore are especially not ruled out. The higher the color rendering index, the truer, or truer to nature, the color impression perceived.

Working Examples

The first working example (WE1) of the luminophore having the empirical formula $K_3MoOF_7:Mn^{4+}$ was prepared by means of a solid-state synthesis. This involved first synthesizing $K_3MoOF_7$ in a weld-sealed Cu ampoule at 300° C. from the reactants $KHF_2$ and $MoO_3$ in a molar ratio of 4:1. This was done by heating the oven containing the Cu ampoule at a heating rate of 3° C./min to 300° C. and keeping it at that temperature for 96 h, then cooling at a cooling rate of 0.1° C./min to 250° C. and maintaining that temperature for 24 h, followed by cooling at a cooling rate of 0.1° C./min to 100° C., after which the oven was switched off. In a next step, $K_3MoOF_7$ was reacted with an Mn source in a ball mill in order to dope it with the $Mn^{4+}$ activator. The resultant $K_3MoOF_7$ was subjected to ball milling with $K_2MnF_6$ (molar ratio 1:0.04) for 6×10 min at 300 rpm in the ball mill with 15 min breaks between the runs. The energy introduced by the grinding balls is sufficient to bring about replacement of Mo by Mn in the structure. This step leaves a homogeneously red-glowing material. Studies by means of x-ray powder methods show that the luminophore can be prepared in good quality (see FIG. 4), and that the phase components in the powder are not altered by the ball milling process (see FIG. 5).

Table 1 shows data from single-crystal x-ray structure analysis of WE1.

TABLE 1

| | |
|---|---|
| Empirical formula | $K_3MoOF_7:Mn^{4+}$ |
| Molar mass/g mol$^{-1}$ | 362.22 |
| Temperature/K | 193(2) |
| Crystal system | triclinic |
| Space group | P -1 (No. 2) |
| a/Å | 6.7602(4) |
| b/Å | 8.1443(5) |
| c/Å | 8.3106(5) |

TABLE 1-continued

| | |
|---|---|
| α/° | 115.242(2) |
| β/° | 90.582(2) |
| γ/° | 92.732(2) |
| Volume/Å$^3$ | 413.16(4) |
| Z | 2 |
| $\rho_{calc}$/g cm$^{-3}$ | 2.912 |
| μ/mm$^{-1}$ | 3.167 |
| F(000) | 340 |
| Crystal size/mm$^3$ | 0.045 × 0.025 × 0.015 |
| Radiation | Mo-K$_\alpha$ (λ = 0.71073 Å) |
| 2θ angle range/° | 5.422 to 54.998 |
| hkl range | −8 < h < 8, −10 < k < 10, −10 < l < 10 |
| Reflections measured | 9825 |
| Independent reflections | 1893 [$R_{int}$ = 0.0436, $R_\sigma$ = 0.0325] |
| Restraints/parameter | 0/109 |
| Goodness-of-fit for F$^2$ | 1.154 |
| R values (I ≥ 2σ(I)) | $R_1$ = 0.0336, $wR_2$ = 0.0797 |
| R values (all data) | $R_1$ = 0.0423, $wR_2$ = 0.0802 |
| Residual electron density (max/min)/e Å$^{-3}$ | 1.273/−1.006 |

Table 2 shows position parameters, isotropic deflection parameters and position population in $K_3MoOF_7:Mn^{4+}$ (WE1).

TABLE 2

| Atom | x | y | z | $U_{iso}$ | Population |
|---|---|---|---|---|---|
| Mo1 | 0.74983(6) | 0.66747(6) | 0.83581(5) | 0.01404(12) | 1 |
| K1 | 0.70976(15) | 0.62877(13) | 0.34024(14) | 0.0181(2) | 1 |
| K2 | 0.78846(14) | 0.16025(13) | 0.34678(13) | 0.0168(2) | 1 |
| K3 | 0.23318(15) | 0.83983(14) | 0.12107(13) | 0.0186(2) | 1 |
| F1 | 1.0306(4) | 0.6289(4) | 0.7996(4) | 0.0210(6) | 1 |
| F2 | 0.6906(4) | 0.4693(4) | 0.6054(4) | 0.0261(7) | 1 |
| F3 | 0.4797(4) | 0.7255(4) | 0.8361(4) | 0.0249(6) | 1 |
| F4 | 0.8147(5) | 0.8905(4) | 1.0234(4) | 0.0324(7) | 1 |
| F5 | 0.7995(4) | 0.8057(4) | 0.6841(3) | 0.0182(6) | 1 |
| O1 | 0.7213(5) | 0.5402(5) | 0.9510(5) | 0.0266(8) | 1 |
| F6 | 0.0087(4) | 0.8646(4) | 0.3817(4) | 0.0220(6) | 1 |
| F7 | 0.5229(4) | 0.9093(4) | 0.3566(4) | 0.0250(6) | 1 |

Table 3 shows anisotropic deflection parameters in $K_3MoOF_7:Mn^{4+}$ (WE1).

TABLE 3

| Atom | $U_{11}$ | $U_{22}$ | $U_{33}$ | $U_{23}$ | $U_{13}$ | $U_{12}$ |
|---|---|---|---|---|---|---|
| Mo1 | 0.01225(19) | 0.0177(2) | 0.0180(2) | 0.01297(17) | 0.00232(14) | 0.00178(14) |
| K1 | 0.0192(5) | 0.0136(5) | 0.0200(5) | 0.0057(4) | 0.0001(4) | 0.0017(4) |
| K2 | 0.0197(5) | 0.0160(5) | 0.0161(5) | 0.0083(4) | −0.0003(4) | 0.0017(4) |
| K3 | 0.0232(5) | 0.0181(5) | 0.0140(5) | 0.0060(4) | 0.0025(4) | 0.0041(4) |
| F1 | 0.0129(12) | 0.0238(15) | 0.0264(15) | 0.0105(12) | 0.0021(11) | 0.0041(11) |
| F2 | 0.0261(15) | 0.0181(15) | 0.0224(16) | −0.0025(12) | 0.0024(12) | 0.0015(12) |
| F3 | 0.0156(13) | 0.0307(16) | 0.0270(16) | 0.0104(13) | 0.0050(11) | 0.0074(12) |
| F4 | 0.0431(19) | 0.0251(17) | 0.0211(16) | 0.0018(13) | −0.0028(14) | 0.0077(14) |
| F5 | 0.0242(14) | 0.0172(14) | 0.0160(14) | 0.0099(11) | 0.0012(11) | 0.0001(11) |
| O1 | 0.032(2) | 0.033(2) | 0.030(2) | 0.0271(18) | 0.0080(16) | 0.0048(16) |
| F6 | 0.0222(14) | 0.0225(15) | 0.0220(15) | 0.0104(13) | 0.0037(11) | −0.0014(12) |
| F7 | 0.0221(14) | 0.0246(15) | 0.0295(17) | 0.0123(13) | −0.0008(12) | 0.0052(12) |

Table 4 shows a comparison of the optical data of $K_3MoOF_7:Mn^{4+}$ and $K_2SiF_6:Mn^{4+}$

TABLE 4

| | $\lambda_{dom}$*/ nm | $\lambda_{max}$/ nm | $x_{CIE}$ | $y_{CIE}$ | LER/lm $W_{opt}^{-1}$ |
|---|---|---|---|---|---|
| $K_3MoOF_7:Mn^{4+}$ | 619 | 627 | 0.690(1) | 0.310(1) | 218 |
| $K_2SiF_6:Mn^{4+}$ | 621 | 631 | 0.693(1) | 0.307(1) | 204 |

*dominant wavelength

The dominant wavelength is a means of describing non-spectral (polychromatic) mixtures of light in terms of spectral (monochromatic) light perceived to be of a similar shade. In the CIE color space, the line that connects a point for a particular color and the point xCIE=0.333, yCIE=0.333 can be extrapolated such that it meets the outline of the space at two points. The point of intersection closer to said color represents the dominant wavelength of the color as the wavelength of the pure spectral color at this point of intersection. The dominant wavelength is thus the wavelength perceived by the human eye.

Since the electronic transitions for $Mn^{4+}$ (d-d transitions) take place in inner shielded electron shells, the position of the emission band is not, as in the case of $Eu^{2+}$-based luminophores, highly dependent on the environment of the activator in the crystal structure. Thus, the result is always (deep) red emission when $Mn^{4+}$ is surrounded by six O/F atoms (in the form of an octahedron) in the structure. However, slight variations in emission can be achieved via the atomic number of the counterions in the structure and via the absolute symmetry of the Mn octahedra, for example. Since the eye sensitivity curve in the region of this present emission maximum ($\lambda_{max}$~630 nm) of $K_3MoOF_7:Mn^{4+}$ and $K_2SiF_6:Mn^{4+}$ has a large (negative) slope, even a small shift in the emission band (CIE color coordinates $x_{CIE}$ and $y_{CIE}$) results in distinctly different luminous efficacy of radiation (LER), as shown in Table 4. $K_3MoOF_7:Mn^{4+}$ with LER elevated by 7% compared to $K_2SiF_6:Mn^{4+}$ was prepared by a novel two-stage synthesis method. The luminophore also shows a different crystal structure than the reference material $K_2SiF_6:Mn^{4+}$. The inventive luminophore WE1 may, advantageously with respect to $K_2SiF_6:Mn^{4+}$, be used for solutions in the field of white conversion LEDs having particularly high color rendering index, especially in combination with high R9 value, for example in general lighting or in background lighting devices that are suitable for representation of large color spaces, for example in displays.

The second working example (WE2) of the luminophore having the empirical formula $K_3WOF_7:Mn^{4+}$ was prepared by means of a solid-state synthesis. This involved first synthesizing $K_3WOF_7$ in a weld-sealed Cu ampoule at 400° C. from the reactants $KHF_2$ and $WO_3$ in a molar ratio of 3:1. This was done by heating the oven containing the Cu ampoule at a heating rate of 3° C./min to 400° C. and keeping it at that temperature for 48 h, then cooling at a cooling rate of 0.1° C./min to 350° C. and then switching off the oven. In a next step, $K_3WOF_7$ was reacted with an Mn source in a ball mill in order to dope it with the activator $Mn^{4+}$. The resultant $K_3WOF_7$ was subjected to ball milling with $K_2MnF_6$ (molar ratio 1:0.04) for 6×10 min at 300 rpm in the ball mill with 15 min breaks between the runs. The energy introduced by the grinding balls is sufficient to bring about replacement of W by Mn in the structure. This step leaves a homogeneously red-glowing material. Studies by means of x-ray powder methods show that the luminophore can be prepared in good quality (see FIG. 9), and that the phase components in the powder are not altered by the ball milling process (see FIG. 10).

Table 5 shows data from single-crystal x-ray structure analysis of WE2.

TABLE 5

| | |
|---|---|
| Empirical formula | $K_3WOF_7:Mn^{4+}$ |
| Molar mass/g mol$^{-1}$ | 450.15 |
| Temperature/K | 186(2) |
| Crystal system | monoclinic |
| Space group | $P2_1/c$ (No. 14) |
| a/Å | 8.8415(4) |
| b/Å | 13.7986(6) |
| c/Å | 6.7970(3) |
| β/° | 93.0410(10) |
| Volume/Å$^3$ | 828.07(6) |
| Z | 4 |
| $\rho_{calc}$/g cm$^{-3}$ | 3.611 |
| μ/mm$^{-1}$ | 15.527 |
| F(000) | 808 |
| Crystal size/mm$^3$ | 0.04 × 0.03 × 0.015 |
| Radiation | Mo-Kα (λ = 0.71073 Å) |
| 2θ angle range/° | 4.614 to 69.982 |
| hkl range | −14 < h < 14, −22 < k < 22, −10 < l < 10 |
| Reflections measured | 63868 |
| Independent reflections | 3643 [$R_{int}$ = 0.0490, $R_\sigma$ = 0.0290] |
| Restraints/parameter | 0/109 |
| Goodness-of-fit for $F^2$ | 1.105 |
| R values (I ≥ 2σ(I)) | $R_1$ = 0.0253, $wR_2$ = 0.0495 |
| R values (all data) | $R_1$ = 0.0334, $wR_2$ = 0.0515 |
| Residual electron density (max/min)/e Å$^{-3}$ | 3.603/−3.178 |

Table 6 shows position parameters, isotropic deflection parameters and position population in $K_3WOF_7:Mn^{4+}$ (WE2).

TABLE 6

| Atom | x | y | z | $U_{iso}$ | Population |
|---|---|---|---|---|---|
| W1 | 0.74918(2) | 0.57684(2) | 0.25859(2) | 0.01365(3) | 1 |
| K1 | 0.52953(8) | 0.64690(5) | 0.77694(10) | 0.01690(13) | 1 |
| K2 | −0.02633(8) | 0.85314(5) | 1.22034(10) | 0.01681(13) | 1 |
| K3 | 1.24774(9) | 0.59684(5) | 0.21794(11) | 0.01794(12) | 1 |
| F1 | 0.7535(4) | 0.70569(18) | 0.2558(4) | 0.0309(5) | 0.5 |
| F2 | 0.7159(3) | 0.5586(2) | 0.5122(3) | 0.0264(5) | 0.5 |
| F3 | 0.7833(2) | 0.57470(17) | −0.0292(3) | 0.0200(4) | 1 |
| F4 | 0.5405(2) | 0.56814(19) | 0.1737(3) | 0.0242(5) | 1 |
| F5 | 0.9613(2) | 0.56142(19) | 0.2993(4) | 0.0269(5) | 1 |
| F6 | 0.7482(3) | 0.43429(15) | 0.2101(4) | 0.0224(4) | 1 |
| F7 | 0.3780(3) | 0.77159(18) | 0.9789(3) | 0.0248(5) | 1 |
| F8 | 0.1279(3) | 0.74494(19) | 0.9957(3) | 0.0260(5) | 1 |
| O1 | 0.7535(4) | 0.70569(18) | 0.2558(4) | 0.0309(6) | 0.5 |
| O2 | 0.7159(3) | 0.5586(2) | 0.5122(3) | 0.0264(5) | 0.5 |

Table 7 shows anisotropic deflection parameters in $K_3WOF_7:Mn^{4+}$ (WE2).

TABLE 7

| Atom | $U_{11}$ | $U_{22}$ | $U_{33}$ | $U_{23}$ | $U_{13}$ | $U_{12}$ |
|---|---|---|---|---|---|---|
| W1 | 0.01517(5) | 0.01271(5) | 0.01320(5) | −0.00098(4) | 0.00188(3) | −0.00095(5) |
| K1 | 0.0135(3) | 0.0192(3) | 0.0181(3) | 0.0013(2) | 0.0020(2) | 0.0028(2) |

TABLE 7-continued

| Atom | $U_{11}$ | $U_{22}$ | $U_{33}$ | $U_{23}$ | $U_{13}$ | $U_{12}$ |
|---|---|---|---|---|---|---|
| K2 | 0.0138(3) | 0.0172(3) | 0.0196(3) | −0.0005(2) | 0.0019(2) | 0.0026(2) |
| K3 | 0.0136(3) | 0.0149(3) | 0.0253(3) | −0.0014(2) | 0.0010(2) | −0.0004(2) |
| F1 | 0.0365(14) | 0.0127(10) | 0.0448(16) | −0.0035(11) | 0.0141(12) | −0.0001(12) |
| F2 | 0.0255(12) | 0.0397(16) | 0.0143(10) | 0.0029(9) | 0.0052(8) | 0.0012(11) |
| F3 | 0.0228(10) | 0.0266(11) | 0.0109(8) | 0.0008(7) | 0.0054(7) | 0.0000(9) |
| F4 | 0.0090(9) | 0.0354(13) | 0.0281(11) | 0.0018(9) | −0.0010(7) | 0.0010(9) |
| F5 | 0.0105(9) | 0.0334(14) | 0.0367(13) | −0.0006(10) | −0.0001(8) | −0.0007(9) |
| F6 | 0.0196(9) | 0.0110(9) | 0.0368(12) | −0.0019(8) | 0.0018(9) | −0.0007(8) |
| F7 | 0.0217(11) | 0.0290(12) | 0.0236(10) | −0.0088(9) | 0.0009(8) | 0.0012(9) |
| F8 | 0.0200(11) | 0.0301(12) | 0.0279(11) | −0.0101(9) | 0.0021(8) | 0.0012(9) |
| O1 | 0.0365(14) | 0.0127(10) | 0.0448(16) | −0.0035(11) | 0.0141(12) | −0.0001(12) |
| O2 | 0.0255(12) | 0.0397(16) | 0.0143(10) | 0.0029(9) | 0.0052(8) | 0.0012(11) |

Table 8 shows a comparison of the optical date of $K_3WOF_7:Mn^{4+}$ and $K_2SiF_6:Mn^{4+}$

TABLE 8

| | $\lambda_{dom}/$ nm | $\lambda_{max}/$ nm | $x_{CIE}$ | $y_{CIE}$ | LER/lm $W_{opt}^{-1}$ |
|---|---|---|---|---|---|
| $K_3WOF_7:Mn^{4+}$ | 619 | 627 | 0.689(1) | 0.311(1) | 225 |
| $K_2SiF_6:Mn^{4+}$ | 621 | 631 | 0.693(1) | 0.307(1) | 204 |

Since the electronic transitions for $Mn^{4+}$ (d-d transitions) take place in inner shielded electron shells, the position of the emission band is not, as in the case of $Eu^{2+}$-based luminophores, highly dependent on the environment of the activator in the crystal structure. Thus, the result is always (deep) red emission when $Mn^{4+}$ is surrounded by six O/F atoms (in the form of an octahedron) in the structure. However, slight variations in emission can be achieved via the atomic number of the counterions in the structure and via the absolute symmetry of the Mn octahedra, for example. Since the eye sensitivity curve in the region of this present emission maximum ($\lambda_{max} \sim 630$ nm) of $K_3MoOF_7:Mn^{4+}$ and $K_2SiF_6:Mn^{4+}$ has a large (negative) slope, even a small shift in the emission band (CIE color coordinates $x_{CIE}$ and $y_{CIE}$) results in distinctly different luminous efficacy of radiation (LER), as shown in Table 8. $K_3WOF_7:Mn^{4+}$ with LER elevated by 10% compared to $K_2SiF_6:Mn^{4+}$ was prepared by a novel two-stage synthesis method. The luminophore also shows a different crystal structure than the reference material $K_2SiF_6:Mn^{4+}$. The inventive luminophore WE2 may, advantageously with respect to $K_2SiF_6:Mn^{4+}$, be used for solutions in the field of white conversion LEDs having particularly high color rendering index, especially in combination with high R9 value, for example in general lighting or in background lighting devices that are suitable for representation of large color spaces, for example in displays.

The third working example (WE3) of the luminophore having the empirical formula $K_2NaNbO_2F_4:Mn^{4+}$ was prepared by means of a solid-state synthesis. This involved first synthesizing $K_2NaNbO_2F_4$ in a weld-sealed Cu ampoule at 300° C. from the reactants $KHF_2$, $NaHF_2$ and $Nb_2O_5$ in a molar ratio of 3:3:2. This was done by heating the oven containing the Cu ampoule at a heating rate of 3° C./min to 300° C. and keeping it at that temperature for 1 h, then cooling at a cooling rate of 0.1° C./min to 100° C., and then the oven was switched off. The resultant $K_2NaNbO_2F_4$ crystals are also suitable for phase analysis by means of powder x-ray diffraction (see FIG. 15). In a next step, $K_2NaNbO_2F_4$ was reacted with an Mn source in a ball mill in order to dope it with the activator $Mn^{4+}$. The resultant $K_2NaNbO_2F_4$ was subjected to ball milling with $Cs_2MnF_6$ (molar ratio 1:0.04) for 6×10 min at 300 rpm in the ball mill with 15 min breaks between the runs. The energy introduced by the grinding balls is sufficient to bring about replacement of Nb by Mn in the structure. This step leaves a homogeneously red-glowing material. Studies by means of x-ray powder methods show that the luminophore can be prepared in good quality (see FIG. 15), and that the phase proportions in the powder are not altered by the ball milling process (see FIG. 16).

Table 9 shows data from Rietveld analysis of WE3.

TABLE 9

| Empirical formula | $K_2NaNbO_2F_4:Mn^{4+}$ |
|---|---|
| Molar mass/g mol$^{-1}$ | 302.10 |
| Temperature/K | 296 |
| Crystal system | cubic |
| Space group | Fm-3m (No. 225) |
| a/Å | 8.504(4) |
| Volume/Å$^3$ | 615.0(8) |
| Z | 4 |
| $\rho_{calc}$/g cm$^{-3}$ | 3.263(4) |
| $\mu$/cm$^{-1}$ | 36.963(5) |
| Radiation | Mo-K$_{\alpha 1}$ ($\lambda = 0.7093$ Å) |
| 2θ angle range/° | 2.00 to 41.89 |
| Peak type | PV-TCHZ |
| Data points | 2660 |
| Background function | Chebyshev polynomial (12 parameters) |
| Number of independent parameters | 26 |
| Goodness of fit | 3.31 |
| R values | $R_p = 0.0836$ |
| | $R_{wp} = 0.1267$ |
| | $R_{exp} = 0.0383$ |

Table 10 shows position parameters, isotropic deflection parameters and position population in $K_2NaNbO_2F_4:Mn^{4+}$.

TABLE 10

| Atom | x | y | z | $B_{eq}$ | Population |
|---|---|---|---|---|---|
| Nb1 | 1 | 0.5 | 1 | 1.879 | 1 |
| K1 | 0.75 | 0.75 | 0.75 | 2.171 | 1 |
| Na1 | 1 | 0.5 | 0.5 | 1.161 | 1 |
| O1 | 1 | 0.5 | 0.78431(46) | 2.929 | 0.33 |
| F1 | 1 | 0.5 | 0.78431(46) | 2.929 | 0.67 |

Table 11 shows a comparison of the optical data of $K_2NaNbO_2F_4:Mn^{4+}$ and $K_2SiF_6:Mn^{4+}$

TABLE 11

|  | $\lambda_{dom}$/ nm | $\lambda_{max}$/ nm | $x_{CIE}$ | $y_{CIE}$ | LER/lm $W_{opt}^{-1}$ |
|---|---|---|---|---|---|
| $K_2NaNbO_2F_4:Mn^{4+}$ (powder) | 624 | 632 | 0.699(1) | 0.300(1) | 197 |
| $K_2NaNbO_2F_4:Mn^{4+}$ (single grain) | 622 | 633 | 0.695(1) | 0.305(1) | 200 |
| $K_2SiF_6:Mn^{4+}$ | 621 | 631 | 0.693(1) | 0.307(1) | 204 |

Contrary to expectation, the inventive luminophore $K_2NaNbO_2F_4:Mn^{4+}$ shows similar emission to the reference material $K_2SiF_6:Mn^{4+}$, even though there are oxygen atoms in the first coordination sphere of the $Mn^{4+}$ activator. Review articles in the literature show clearly that oxides always emit at longer wavelengths than the corresponding fluorides [A review on $Mn^{4+}$ activators in solids for warm white light-emitting diodes, RSC Advances 2016, Chen et al.];

Research progress and application prospects of transition metal $Mn^{4+}$-activated Luminescent materials, Journal of Materials Chemistry C 2016, Zhou et al.) The inventive luminophore WE3 may, advantageously with respect to $K_2SiF_6:Mn^{4+}$, be used for solutions in the field of white conversion LEDs having particularly high color rendering index, specifically in combination with high R9 value, for example in general lighting or in background lighting devices suitable for representing large color spaces, for example in displays. In the synthesis of $K_2NaNbO_2F_4:Mn^{4+}$, by contrast with the synthesis of $K_2SiF_6:Mn^{4+}$, no HF is used, which drastically reduces the necessary safety precautions in production and hence can simultaneously distinctly lower the costs for the synthesis.

BRIEF DESCRIPTION OF THE DRAWINGS

Further advantageous embodiments and developments will be apparent from the working examples described hereinafter in conjunction with the figures. Identical, similar or equivalently functioning elements are labelled with the same reference signs in the figures. The figures and the relative proportions of the elements represented in the figures are not to be considered to be true to scale. Instead, individual elements may be shown exaggerated in size for ease of visualization and/or better understanding.

DETAILED DESCRIPTION

Figure 1A:
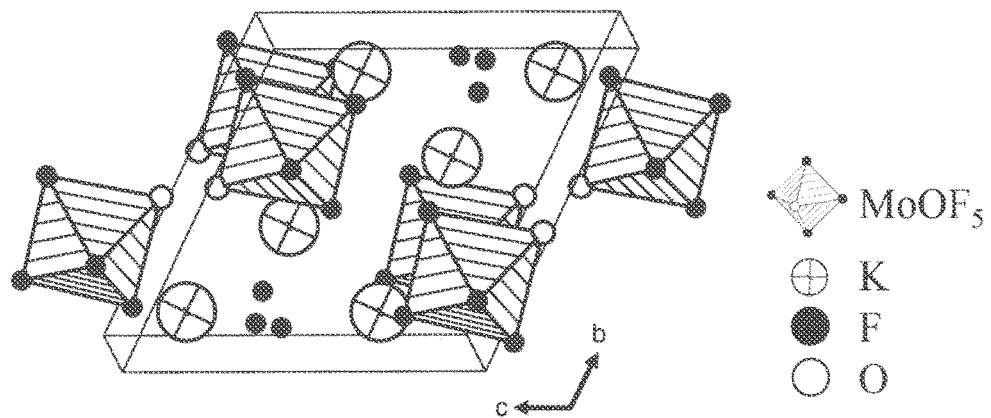
FIG. 1A shows a unit cell with adjoining polyhedra of the first working example $K_3MoOF_7:Mn^{4+}$ (WE1) of the luminophore (space group No. 2; P-1).

FIG. 1A shows a unit cell with adjoining polyhedra of $K_3MoOF_7:Mn^{4+}$ along [−100]. $K_3MoOF_7:Mn^{4+}$, by comparison with $K_2SiF_6:Mn^{4+}$, surprisingly crystallizes in a new, unknown structure type in the P-1 space group (No. 2); the unit cell shows a triclinic metric with lattice parameters a=6.7602(4), b=8.1443(5), c=8.3106(5) Å and α=115.242 (2), β=90.582(2), γ=92.732(2)° (volume=413.16(4) Å³). The crystallographic data are summarized in tables 1-3. Mo has partly been replaced by $Mn^{4+}$ (not shown).

Figure 1B:
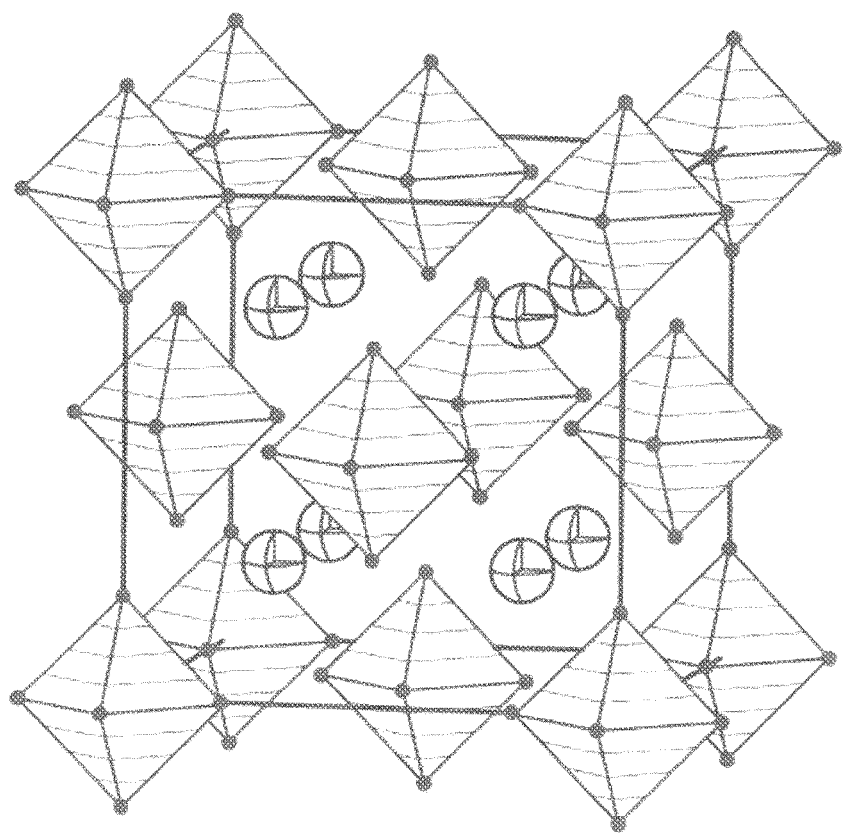
FIG. 1B shows a unit cell of cubic $K_2SiF_6:Mn^{4+}$ (space group No. 225; Fm-3m).

FIG. 1B shows the unit cell of the crystal structure of $K_2SiF_6:Mn^{4+}$, which crystallizes in the cubic space group Fm-3m. The K atoms are shown as unfilled ellipsoids, the F atoms as filled circles, and $SiF_6$ octahedra with Si in the center and F shaded at the vertices. Si has been partly replaced by Mn (not shown). $K_2SiF_6:Mn^{4+}$ crystallizes in the $K_2PtCl_6$ type in the Fm-3m space group (No. 225). The unit cell shows a cubic metric with a lattice parameter a=8.134(1) Å.

A comparison of FIGS. 1A and 1B shows that the two structures differ significantly from one another. In cubic $K_2SiF_6:Mn^{4+}$ there are exclusively $SiF_6$ octahedra formed from F anions, and in $K_3MoOF_7:Mn^{4+}$ there are $MoOF_5$ octahedra formed from O and F anions. By virtue of the arrangement of the O/F atoms, the Mo atom is deflected in each case from the middle of the octahedron in the direction of the O atom (higher covalence of the Mo—O bond than of the Mo—F bond, not shown in the figure). The position and orientation of the respective octahedra in relation to the unit cell are likewise distinctly different from one another in the two structures.

Figure 2:
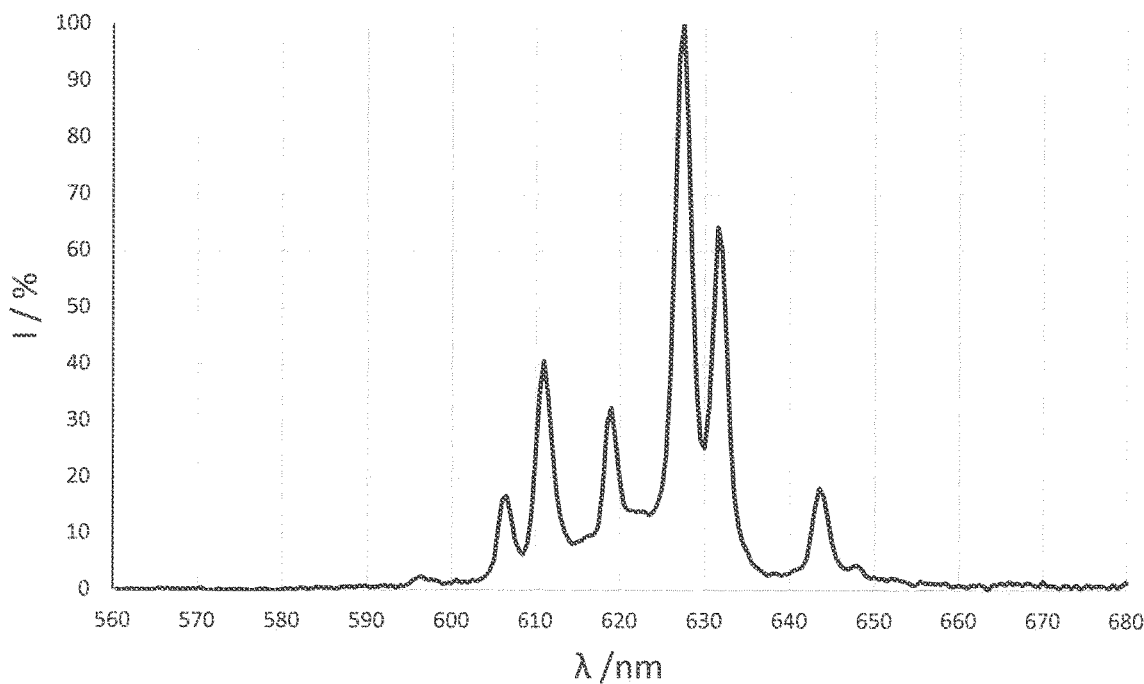
FIG. 2 shows an emission spectrum of WE1 (powder sample) on excitation with blue primary radiation ($\lambda_{exc}$=460 nm).

FIG. 2 shows an emission spectrum of a powder sample of WE1 on excitation with blue primary radiation ($\lambda_{exc}$=460 nm). The x axis shows the wavelength in nanometers, and the y axis the relative intensity in percent. The emission maximum is at 627 nm.

Figure 3:
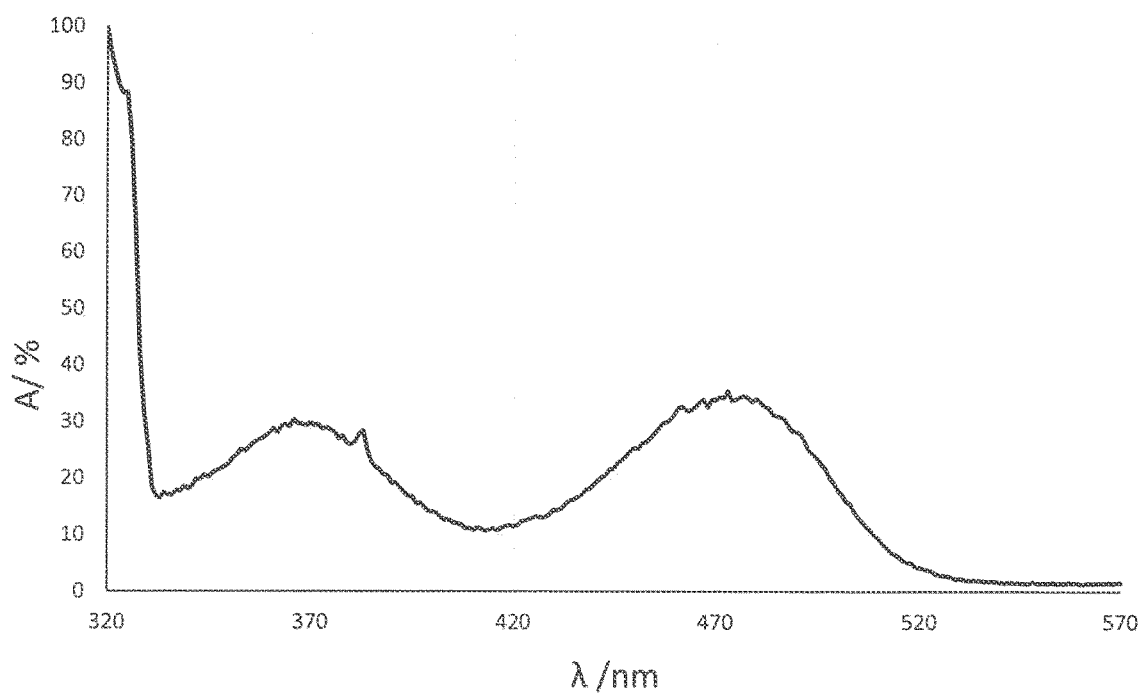
FIG. 3 shows the excitation spectrum of WE1 based on the emission maximum at 627 nm.

FIG. 3 shows the excitation spectrum of WE1 based on the emission maximum at 627 nm. The x axis shows the wavelength in nanometers, and the y axis the relative spectral absorption in percent.

Figure 4:
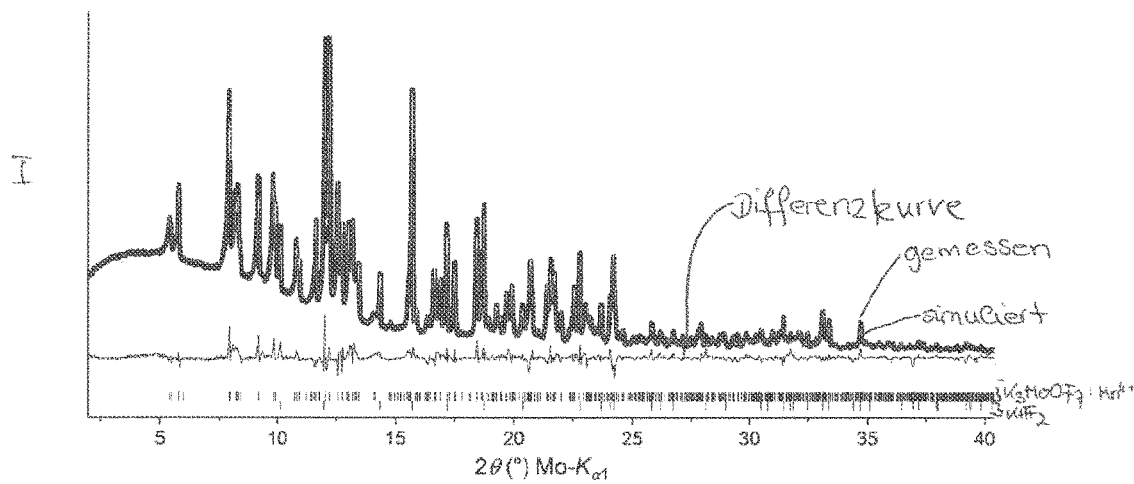
FIG. 4 shows a Rietveld refinement of a powder sample of $K_3MoOF_7:Mn^{4+}$ (WE1).

FIG. 4 shows a Rietveld refinement of a powder sample of $K_3MoOF_7:Mn^{4+}$. The measured curve is represented by the bold curve. The simulation is shown as a light-colored line above the measurement curve. In addition, as well as the difference curve, the reflection positions of $K_3MoOF_7:Mn^{4+}$ and the $KHF_2$ present in the luminophore composition are shown.

Figure 5:
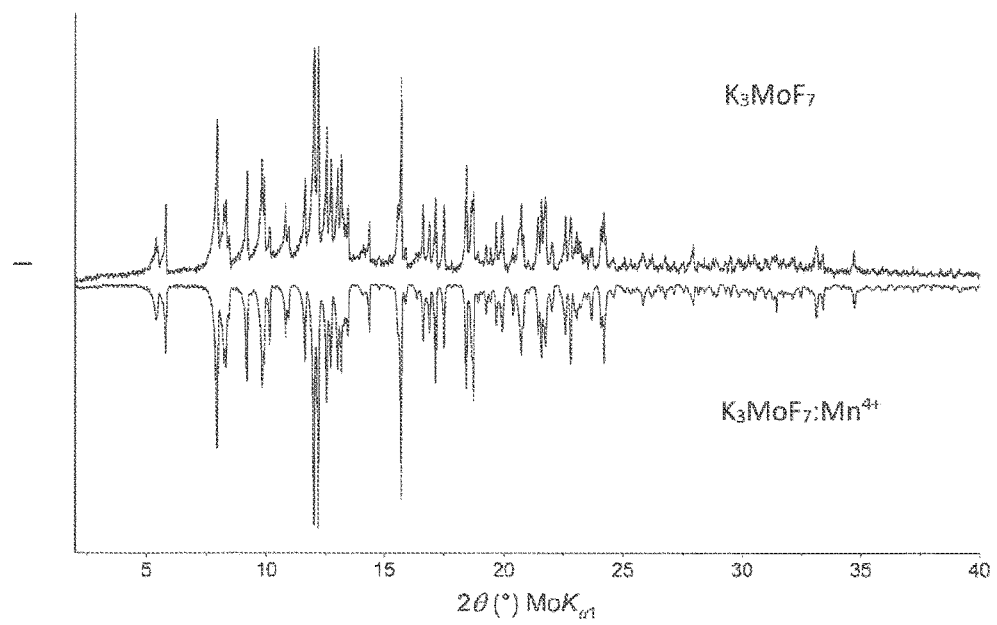
FIG. 5 shows a PXRD comparison (Mo—$K_{\alpha1}$ radiation) of $K_3MoOF_7$ and $K_3MoOF_7:Mn^{4+}$ (WE1).

FIG. 5 shows a PXRD comparison (Mo—$K_{\alpha 1}$ radiation) of undoped $K_3MoOF_7$ before the ball milling process (intermediate in the synthesis of WE1) with the experimental PXRD of $K_3MoOF_7:Mn^{4+}$ after the ball milling process. Good agreement is apparent, and so these studies by means of x-ray diffraction show that the structure of $K_3MoOF_7$ is conserved by the ball milling process in the case of $K_3MoOF_7:Mn^{4+}$ too.

Figure 6:
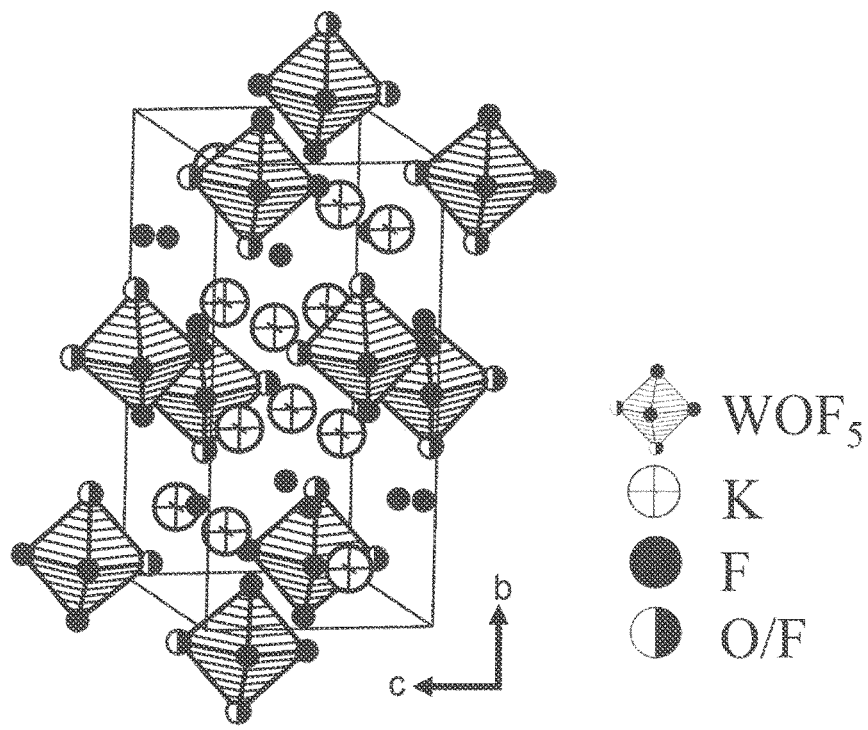
FIG. 6 shows a unit cell of the second working example $K_3WOF_7:Mn^{4+}$ (WE2) of the luminophore (space group No. 14; $P2_1/c$).

FIG. 6 shows a unit cell of $K_3WOF_7:Mn^{4+}$ along [−100]. $K_3WOF_7:Mn^{4+}$, by comparison with $K_2SiF_6:Mn^{4+}$, surprisingly crystallizes in a new, unknown structure type in the P$2_1$/c space group (No. 14). The unit cell shows monoclinic metric with lattice parameters a=8.8415(4), b=13.7986(6), c=6.7970(3) Å and β=93.0410(10)° (volume=828.07(6) Å$^3$). The crystallographic data are summarized in tables 5 to 7. W has been partly replaced by $Mn^{4+}$ (not shown).

A comparison of FIGS. 6 and 1B shows that the structures of $K_3WOF_7:Mn^{4+}$ and $K_2SiF_6:Mn^{4+}$ differ significantly. In cubic $K_2SiF_6:Mn^{4+}$ there are exclusively $SiF_6$ octahedra formed from F anions, and in $K_3WOF_7$:Mn there are $WOF_5$ octahedra formed from O and F anions. The ordering of the O/F atoms (with occupation in each case of half of 2 of the 6 octahedral vertices with O and F), the W atom is deflected in each case from the middle of the octahedron in the direction of the mixedly occupied O/F positions (higher covalence of the W—O bond than of the W—F bond, not shown in the figure). The position and orientation of the respective octahedra in relation to the unit cell are likewise distinctly different from one another in the two structures.

Figure 7:
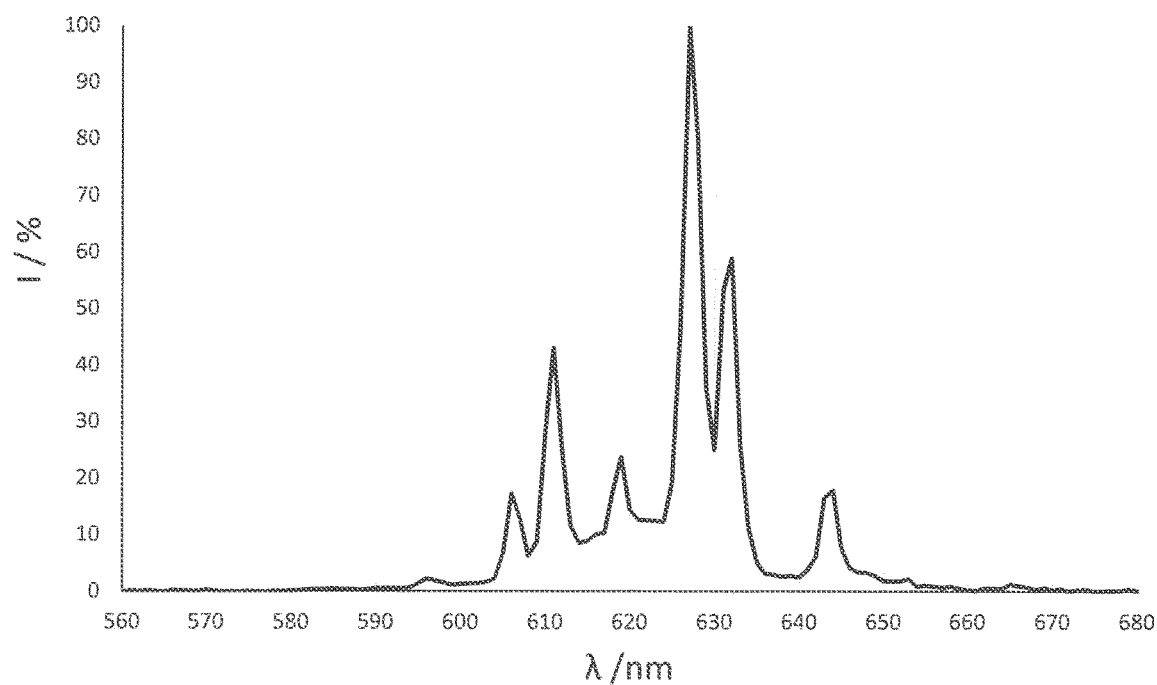
FIG. 7 shows an emission spectrum of WE2 (powder sample) on excitation with blue primary radiation ($\lambda_{exc}$=460 nm).

FIG. 7 shows an emission spectrum of a powder sample of WE2 on excitation with blue primary radiation ($\lambda_{exc}$=460 nm). The emission maximum is at 627 nm.

Figure 8:
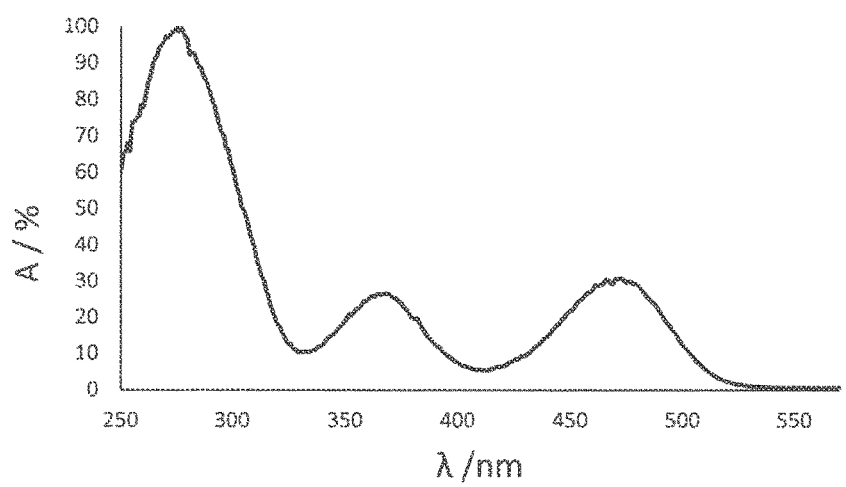
FIG. 8 shows the excitation spectrum of WE2 based on the emission maximum at 627 nm.

FIG. 8 shows the excitation spectrum of WE2 based on the emission maximum at 627 nm.

Figure 9:
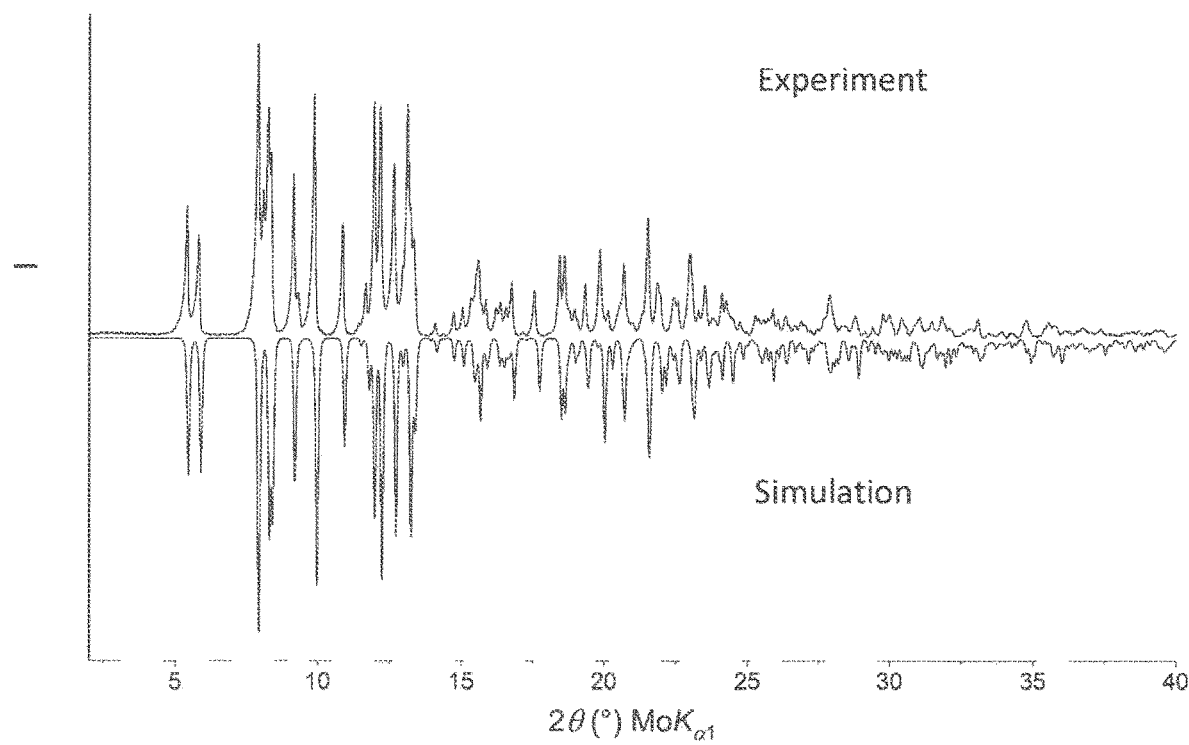
FIG. 9 shows a comparison of powder x-ray diffractograms (PXRD) (Mo—$K_{\alpha1}$ radiation) of $K_3WOF_7:Mn^{4+}$ from experiment and simulation.

FIG. 9 shows a comparison of powder x-ray diffractograms (PXRD) (Mo—$K_{\alpha 1}$ radiation). What is shown is the x-ray diffractogram measured for the second working example WE2 of the inventive luminophore $K_3WOF_7:Mn^{4+}$ compared to a simulation based on single-crystal x-ray diffraction data. Good agreement is apparent, and so these studies by means of x-ray powder methods show that the luminophore $K_3WOF_7:Mn^{4+}$ was preparable in good quality.

Figure 10:
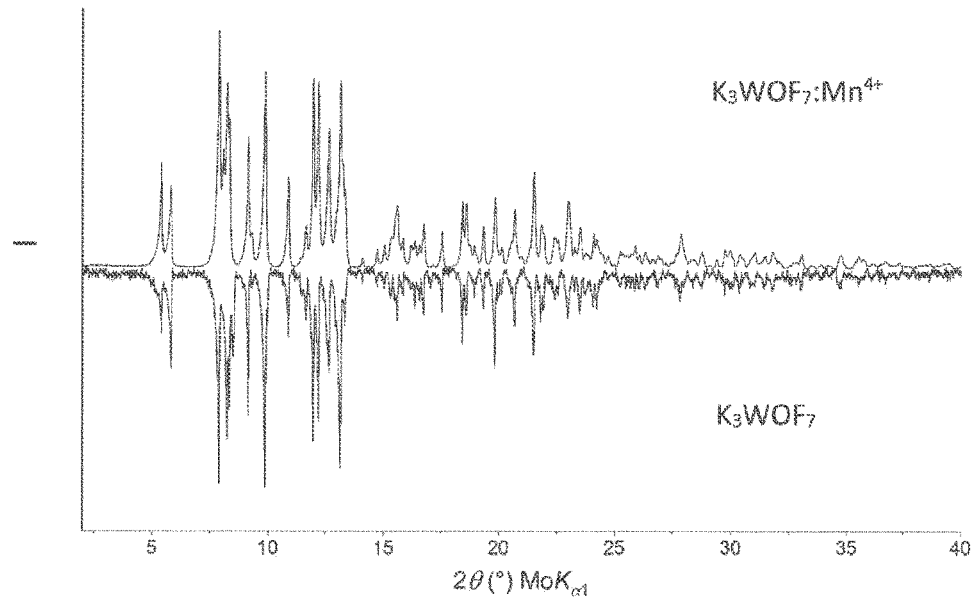
FIG. 10 shows a PXRD comparison (Mo—$K_{\alpha1}$ radiation) of $K_3MoOF_7$ and $K_3MoOF_7:Mn^{4+}$.

FIG. 10 shows a PXRD comparison (Mo—$K_{\alpha 1}$ radiation) of undoped $K_3MoOF_7$ before the ball milling process (intermediate in the synthesis of WE2) with the experimental PXRD of $K_3WOF_7:Mn^{4+}$ after the ball milling process. Good agreement is apparent, and so these studies by means of x-ray diffraction show that the structure of $K_3WOF_7$ is conserved by the ball milling process in the case of $K_3WOF_7:Mn^{4+}$ too.

Figure 11:
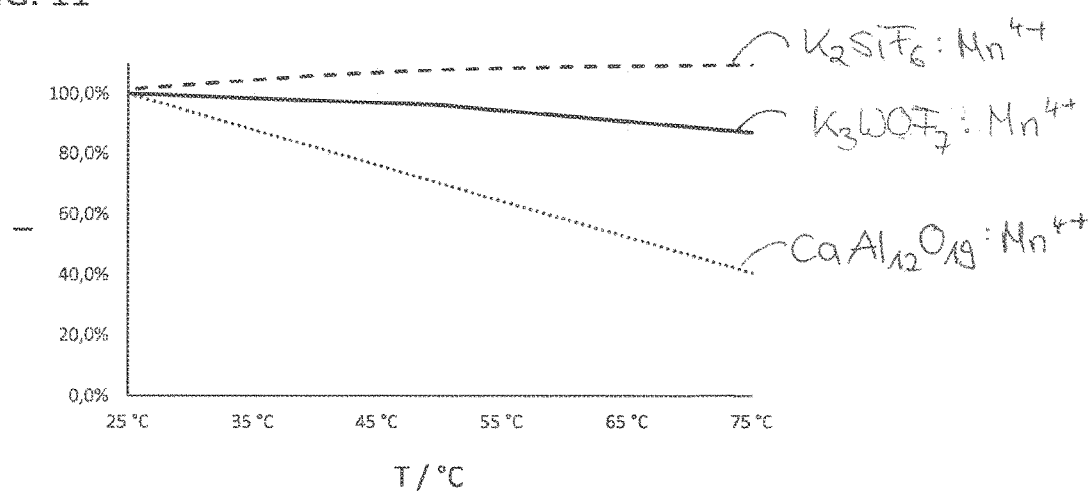
FIG. 11 shows the thermal characteristics of various luminophores in comparison.

FIG. 11 shows the progression of integral intensity I against the temperature of the luminophores $K_2SiF_6:Mn^{4+}$, $K_3WOF_7:Mn^{4+}$ and $CaAl_{12}O_{19}:Mn^{4+}$. The slow decay time of the $Mn^{4+}$ atom, i.e. the slow transition from the excited state to the ground state, which is within the ms range, limits solutions with such luminophores essentially to "low-power" applications (few blue photons/time and area). Otherwise, saturation of the excited state sets in and any further incident blue photon does not trigger a conversion process, such that the overall efficiency of the LED then falls significantly. In such cases, the LED chips, i.e. the semiconductor layer sequences, typically reach temperatures well below 100° C., in view of which a decrease in intensity of only 13% for $K_3WOF_7$:Mn at 75° C. constitutes a surprisingly good value. $CaAl_{12}O_{19}:Mn^{4+}$ shows that the temperature characteristics of oxidic luminophores are much poorer than those of the corresponding fluoridic luminophores. The data for $K_2SiF_6:Mn^{4+}$ are known from the literature [Temperature dependence of photoluminescence spectra and dynamics of the red-emitting $K_2SiF_6:Mn^{4+}$ phosphor, Journal of Alloys and Compounds 2017, Shao et al.]

Figure 12:
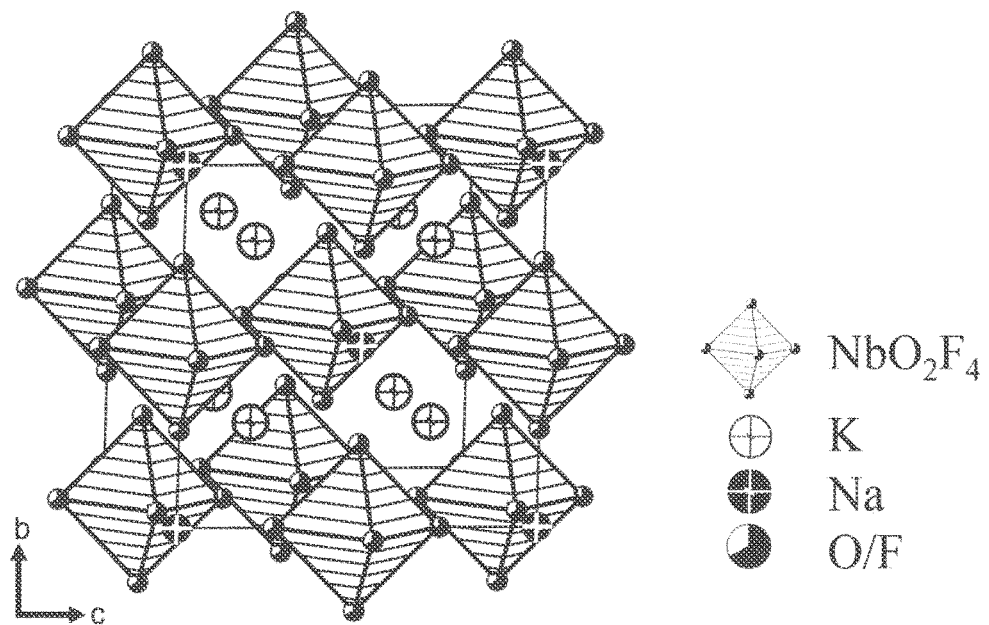
FIG. 12 shows a unit cell of the third working example $K_2NaNbO_2F_4:Mn^{4+}$ (WE3) of the luminophore (space group No. 225; Fm-3m).

FIG. 12 shows a unit cell of $K_2NaNbO_2F_4:Mn^{4+}$ along [−100]. $K_2NaNbO_2F_4:Mn^{4+}$ crystallizes in the perovskite structure class in the elpasolite structure type ($K_2NaAlF_6$) like $K_2SiF_6:Mn^{4+}$ in the Fm-3m space group (No. 225). The unit cell thus also shows cubic metric with lattice parameter a=8.4726(4) Å (volume=608.21 Å$^3$). The crystallographic data are summarized in tables 9 and 10.

A comparison of FIGS. 12 and 1B shows that the structures of $K_2NaNbO_2F_4:Mn^{4+}$ and $K_2SiF_6:Mn^{4+}$ differ from one another. In cubic $K_2SiF_6:Mn^{4+}$ there are exclusively $SiF_6$ octahedra formed from F anions, and in $K_2NaNbO_2F_4:Mn^{4+}$ there are $NbO_2F_4$ octahedra formed from O and F anions.

Figure 13:
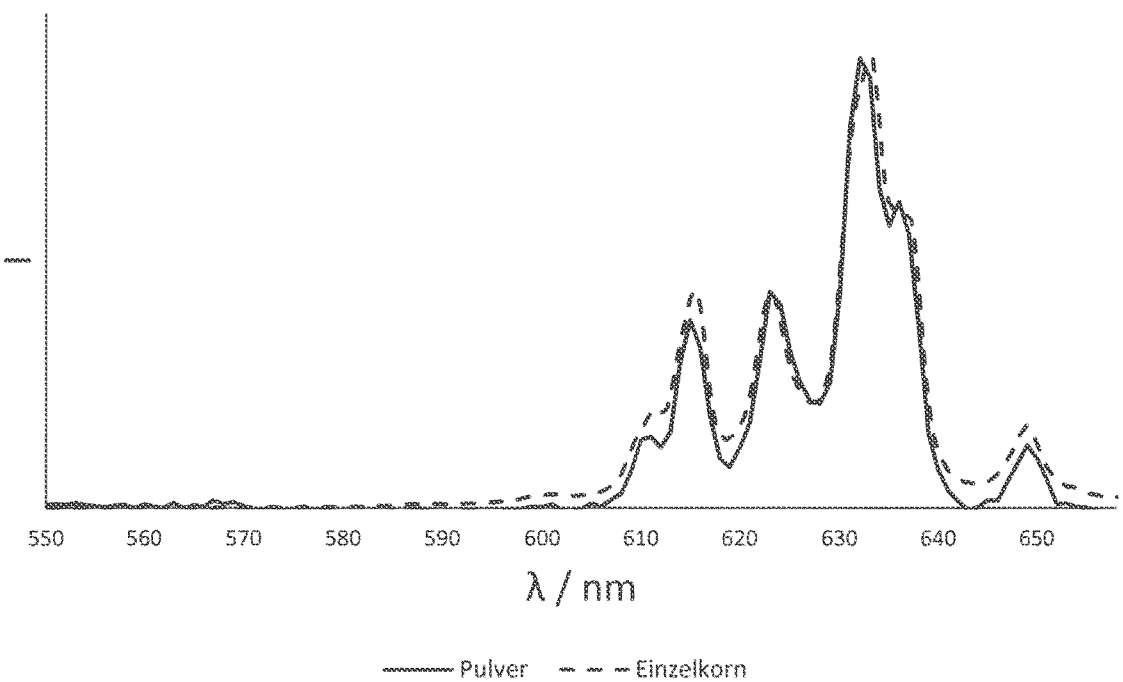
FIG. 13 shows an emission spectrum of WE3 (powder sample and single grain) on excitation with blue primary radiation.

FIG. 13 shows an emission spectrum of a powder sample and of a single grain of WE3 on excitation with blue primary radiation ($\lambda_{exc}$=460 nm powder; ($\lambda_{exc}$=448 nm single grain). The emission maximum of the powder sample is at 632 nm, and that of the single grain at 633 nm.

Figure 14:
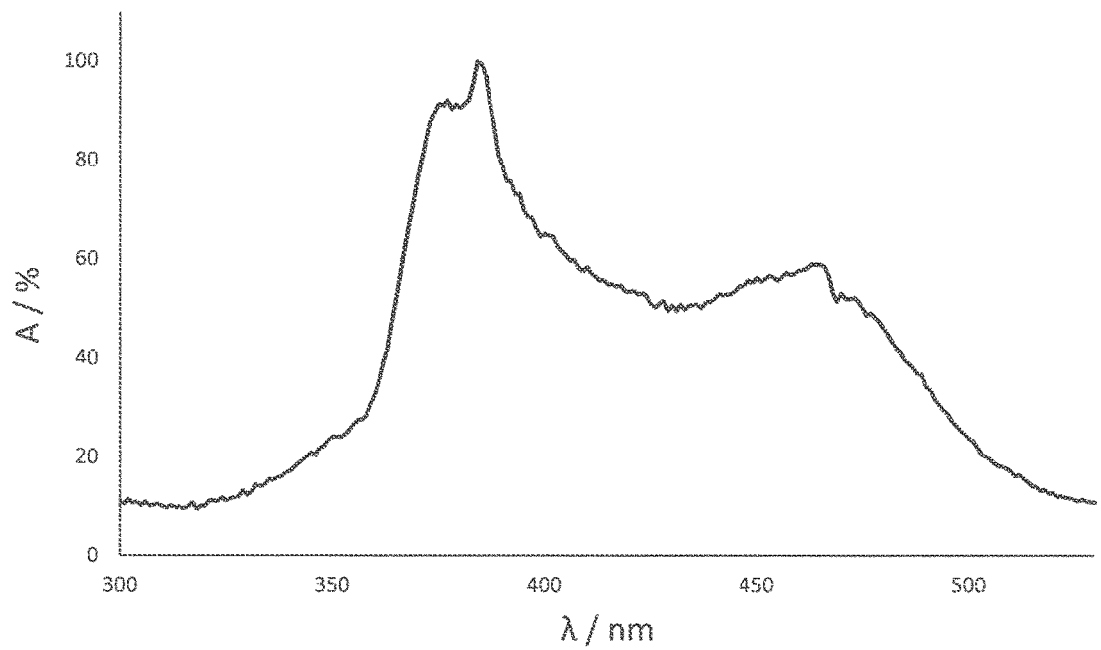
FIG. 14 shows the excitation spectrum of WE3 based on the emission maximum at 632 nm.

FIG. 14 shows the excitation spectrum of WE3 based on the emission maximum at 632 nm.

Figure 15:
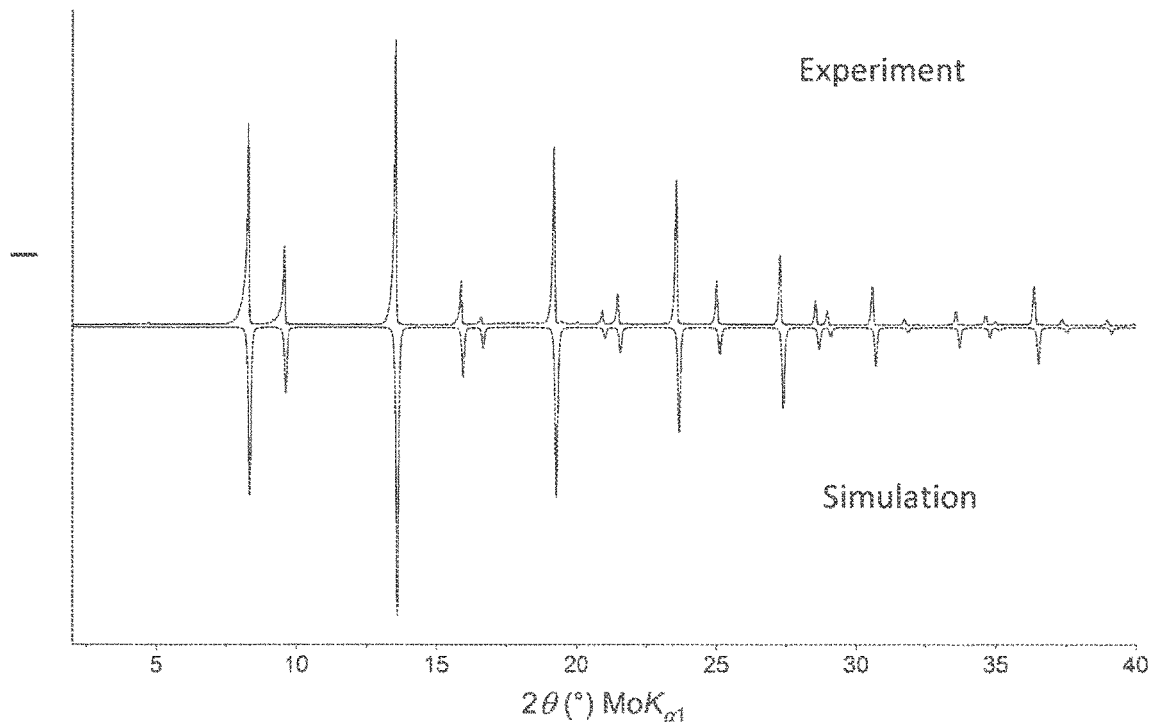
FIG. 15 shows a comparison of powder x-ray diffractograms (PXRD) (Mo—$K_{\alpha1}$ radiation) of $K_2NaNbO_2F_4:Mn^{4+}$ from experiment and simulation.

FIG. 15 shows a comparison of powder x-ray diffractograms (PXRD) (Mo—$K_{\alpha 1}$ radiation). What is shown is the x-ray diffractogram measured for the third working example WE3 of the inventive luminophore $K_2NaNbO_2F_4:Mn^{4+}$ compared to a simulation based on x-ray diffraction data. Good agreement is apparent, and so these studies by means of x-ray powder methods show that the luminophore $K_2NaNbO_2F_4:Mn^{4+}$ was preparable in good quality.

Figure 16:
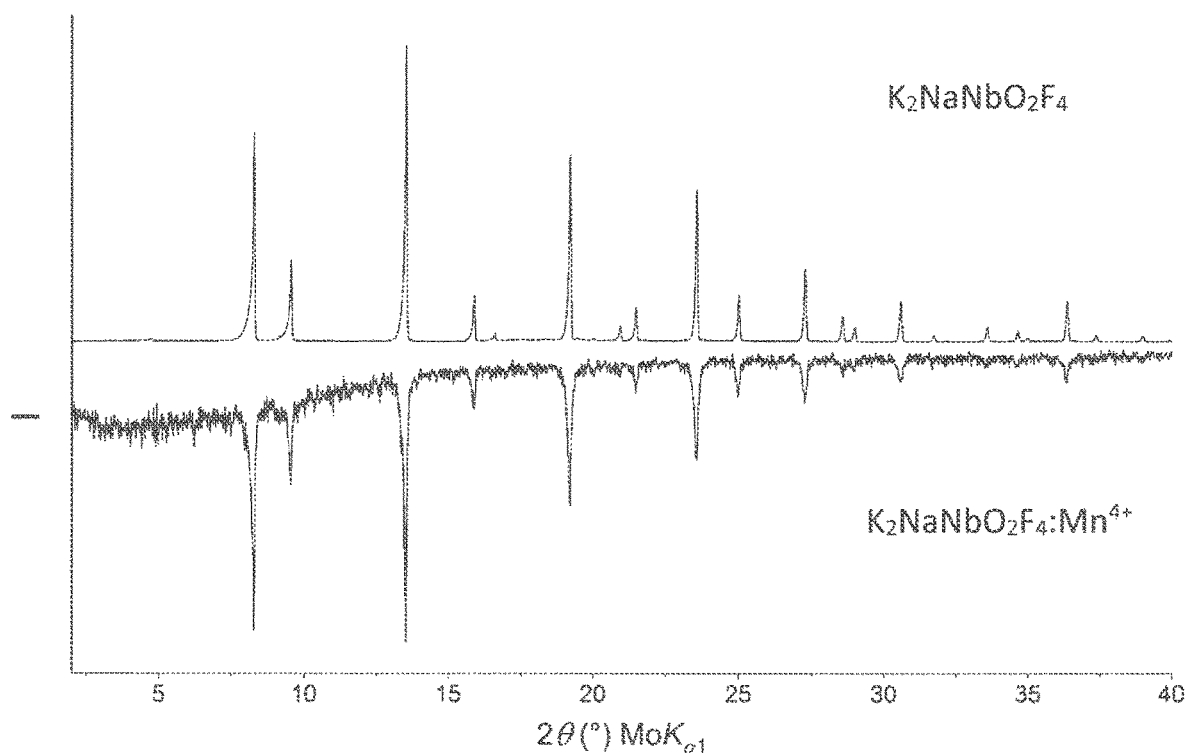
FIG. 16 shows a PXRD comparison (Mo—$K_{\alpha1}$ radiation) of $K_2NaNbO_2F_4$ and $K_2NaNbO_2F_4:Mn^{4+}$.

FIG. 16 shows a PXRD comparison (Mo—$K_{\alpha 1}$ radiation) of undoped $K_2NaNbO_2F_4$ before the ball milling process (intermediate in the synthesis of WE3) with the experimental PXRD of $K_2NaNbO_2F_4:Mn^{4+}$ after the ball milling process. Good agreement is apparent, and so these studies by means of x-ray diffraction show that the structure of $K_2NaNbO_2F_4$ is conserved by the ball milling process in the case of $K_2NaNbO_2F_4:Mn^{4+}$ too.

The working examples described in conjunction with the figures and the features thereof may also be combined with one another in further working examples, even if such combinations are not shown explicitly in the figures. In addition, the working examples described in conjunction with the figures may have additional or alternative features according to the general part of the description.

LIST OF REFERENCE SYMBOLS

A spectral absorption
WE working example
LED light-emitting diode
CRI color rendering index
LER luminous efficacy of radiation
CCT correlated color temperature
FWHM spectral width of emission, half-height width
ppm parts per million VB comparative example
I intensity
mol % mole percent
nm nanometers
° C. degrees Celsius
$\lambda_{exc}$ excitation wavelength
$\lambda_{peak}$ peak wavelength
$\lambda_{max}$ emission maximum
$\lambda_{dom}$ dominant wavelength

The invention claimed is:

1. A luminophore having the empirical formula $A_3M^*O_xF_{9-2x}:Mn^{4+}$;
   wherein:
   A is selected from the group consisting of Li, Na, Rb, K, Cs, and combinations thereof;
   M* is selected from the group consisting of Cr, Mo, W, and combinations thereof; and
   $0<x<4.5$.

2. The luminophore as claimed in claim 1, wherein $x=1$, $x=2$, $x=3$, or $x=4$.

3. The luminophore as claimed in claim 1 having the empirical formula $(K_{1-z}A^*_z)_3M^*O_xF_{9-2x}:Mn^{4+}$;
   wherein:
   A* is selected from the group consisting of Li, Na, Rb, Cs, and combinations thereof;
   M* is selected from the group consisting of Cr, Mo, W, and combinations thereof;
   $0 \leq z \leq 1$; and
   $x=1$, $x=2$, $x=3$ or $x=4$.

4. The luminophore as claimed in claim 1 having the empirical formula $K_3M^*O_xF_{9-2x}:Mn^{4+}$;
   wherein:
   M* is selected from the group consisting of Cr, Mo, W, and combinations thereof; and
   $x=1$, $x=2$, $x=3$, or $x=4$.

5. The luminophore as claimed in claim 1 having the empirical formula $K_3M^*OF_7:Mn^{4+}$;
   wherein:
   M* is selected from the group consisting of Cr, Mo, W, and combinations thereof.

6. A conversion LED comprising a luminophore as claimed in claim 2.

7. The conversion LED as claimed in claim 6, further comprising:
   a semiconductor layer sequence configured to emit electromagnetic primary radiation; and
   a conversion element that comprises the luminophore and configured to at least partially convert the electromagnetic primary radiation to electromagnetic secondary radiation.

8. A luminophore having the empirical formula $A_3MO_xF_{8-2x}:Mn^{4+}$;
   wherein:
   A is selected from the group consisting of Li, Na, Rb, K, Cs, and combinations thereof;
   M is selected from the group consisting of V, Nb, and combinations thereof; and
   $1<x<4$.

9. The luminophore as claimed in claim 8, wherein $x=2$ or $x=3$.

10. The luminophore as claimed in claim 9 having the empirical formula $(K_{1-z}A^*_z)_3MO_xF_{8-2x}:Mn^{4+}$;
    wherein:
    A* is selected from the group consisting of Li, Rb, Na, Cs, and combinations thereof;
    M is selected from the group consisting of V, Nb, and combinations thereof;
    $0 \leq z \leq 1$; and
    $x=2$ or $x=3$.

11. The luminophore as claimed in claim 10 having the empirical formula $(K_{1-z}Na_z)_3MO_xF_{8-2x}:Mn^{4+}$;
    wherein:
    M is selected from the group consisting of V, Nb, and combinations thereof;
    $0<z\leq 2/3$; and
    $x=2$ or $x=3$.

12. The luminophore as claimed in claim 11 having the empirical formula $(K_{1-z}Na_z)_3MO_2F_4:Mn^{4+}$;
    wherein:
    M is selected from the group consisting of V, Nb, and combinations thereof; and
    $0<z\leq 2/3$.

* * * * *

UNITED STATES PATENT AND TRADEMARK OFFICE
CERTIFICATE OF CORRECTION

| | | |
|---|---|---|
| PATENT NO. | : 12,152,185 B2 | Page 1 of 1 |
| APPLICATION NO. | : 17/610736 | |
| DATED | : November 26, 2024 | |
| INVENTOR(S) | : Markus Seibald et al. | |

It is certified that error appears in the above-identified patent and that said Letters Patent is hereby corrected as shown below:

On the Title Page

In (72) Inventors:
Change "Hubert Huppertz, Tegernheim (DE)" to --Hubert Huppertz, Innsbruck (AT)--

Signed and Sealed this
Thirty-first Day of December, 2024

Derrick Brent
*Acting Director of the United States Patent and Trademark Office*